United States Patent [19]

Hutter et al.

[11] Patent Number: 5,719,421
[45] Date of Patent: Feb. 17, 1998

[54] DMOS TRANSISTOR WITH LOW ON-RESISTANCE AND METHOD OF FABRICATION

[75] Inventors: Louis N. Hutter, Richardson; John P. Erdeljac, Plano, both of Tex.

[73] Assignee: Texas Instruments Incorporated, Dallas, Tex.

[21] Appl. No.: 775,758

[22] Filed: Dec. 31, 1996

Related U.S. Application Data

[60] Continuation of Ser. No. 472,443, Jun. 7, 1995, abandoned, which is a division of Ser. No. 322,906, Oct. 13, 1994, abandoned.

[51] Int. Cl.$^6$ .................................................. H01L 29/78
[52] U.S. Cl. ...................................... 257/335; 257/342
[58] Field of Search ............................. 257/342, 335

[56] References Cited

U.S. PATENT DOCUMENTS

| | | | |
|---|---|---|---|
| 4,843,441 | 6/1989 | Willard | 257/270 |
| 4,914,051 | 4/1990 | Huie et al. | 437/59 |
| 4,952,991 | 8/1990 | Kayama | 257/335 |
| 5,086,332 | 2/1992 | Nakagawa et al. | 257/538 |
| 5,171,699 | 12/1992 | Hutter et al. | 437/41 |
| 5,250,449 | 10/1993 | Kuroyamagi | 257/342 |
| 5,317,180 | 5/1994 | Hutter et al. | 257/335 |

*Primary Examiner*—Jerome Jackson
*Attorney, Agent, or Firm*—W. James Brady, III; Richard L. Donaldson

[57] ABSTRACT

A DMOS transistor (50) includes an Nwell (70); a Dwell (76) formed in the Nwell (70); a source region (78) formed in the Dwell (78), a channel region (80) defined between an edge of the source region (78) and an edge of the Nwell (70); a gate (86) extending over the channel region (80); and a p+ backgate contact region (90) formed in the source region (78) so as to counterdope and extend through a first portion of the source region (78) to contact the Dwell (76). The formation of the p+ backgate contact region through the source region (78) eliminates the need for a large annular shaped source region resulting in a considerable reduction in both device area and on-resistance.

10 Claims, 15 Drawing Sheets

DMOS TRANSISTOR WITH LOW ON-RESISTANCE AND METHOD OF FABRICATION

This application is a Continuation of application Ser. No. 08/472,443, filed Jun. 7, 1995 now abandoned, which is a Division of Ser. No. 08/322,906 filed Oct. 13, 1994 now abandoned.

FIELD OF THE INVENTION

This invention relates to semiconductor devices and, more particularly, to a DMOS transistor having a low on-resistance and method of fabrication thereof.

BACKGROUND OF THE INVENTION

DMOS (double-diffused MOS) transistors are quickly replacing bipolar devices as power devices in intelligent power integrated circuits due to their performance advantage. With any power device, it is important that the device deliver the power in a cost-effective manner. In power devices, a reduction in on-resistance translates into increased cost-effectiveness. On-resistance for DMOS transistors is given by Rdson*Area (where Rdson*Area=drain-to-source resistance when the transistor is on per unit of area). In DMOS transistors according to the prior art, the Dwell is formed by implants made through an annular mask in order to allow unimpeded access to the Dwell backgate region for the subsequent formation of heavily doped backgate contacts. This design strategy consumes considerable silicon area and therefore has a negative impact on device on-resistance.

SUMMARY OF THE INVENTION

Accordingly, a need exists for a DMOS design that consumes less area to provide a reduction in on-resistance.

Generally, and in one form of the invention, a transistor, includes: a semiconductor layer; a first region of a first conductivity type formed in the semiconductor layer; a source region of a second conductivity type opposite the first conductivity type formed in the first region, a channel region defined between an edge of the source region and an edge of the first region; a drain region of the second conductivity type formed in the semiconductor layer, the drain region adjacent the channel region; a gate extending over the channel region; and a backgate contact region of the first conductivity type formed in the source region, the backgate contact region counterdoping and extending through a first portion of the source region to contact the first region.

In another form of the invention, a method for forming a transistor includes the steps of: forming a drain region of a first conductivity type in a semiconductor layer; forming a first region of a second conductivity type opposite the first conductivity type in the semiconductor layer; forming a source region of the first conductivity type in the first region, a channel region being defined between an edge of the source region and an edge of the first region; forming a gate insulated from and extending over the channel region; and forming a backgate contact region of the second conductivity type in the source region, the backgate contact region counterdoping and extending through a first portion of the source region to contact the first region.

An advantage of the invention is a reduction in transistor area resulting from the formation of a non-annular source region and the formation of the backgate contact region in the source region so as to counterdope and extend through a portion of the source region to contact the Dwell. The reduction in transistor area translates into a reduced on-resistance.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
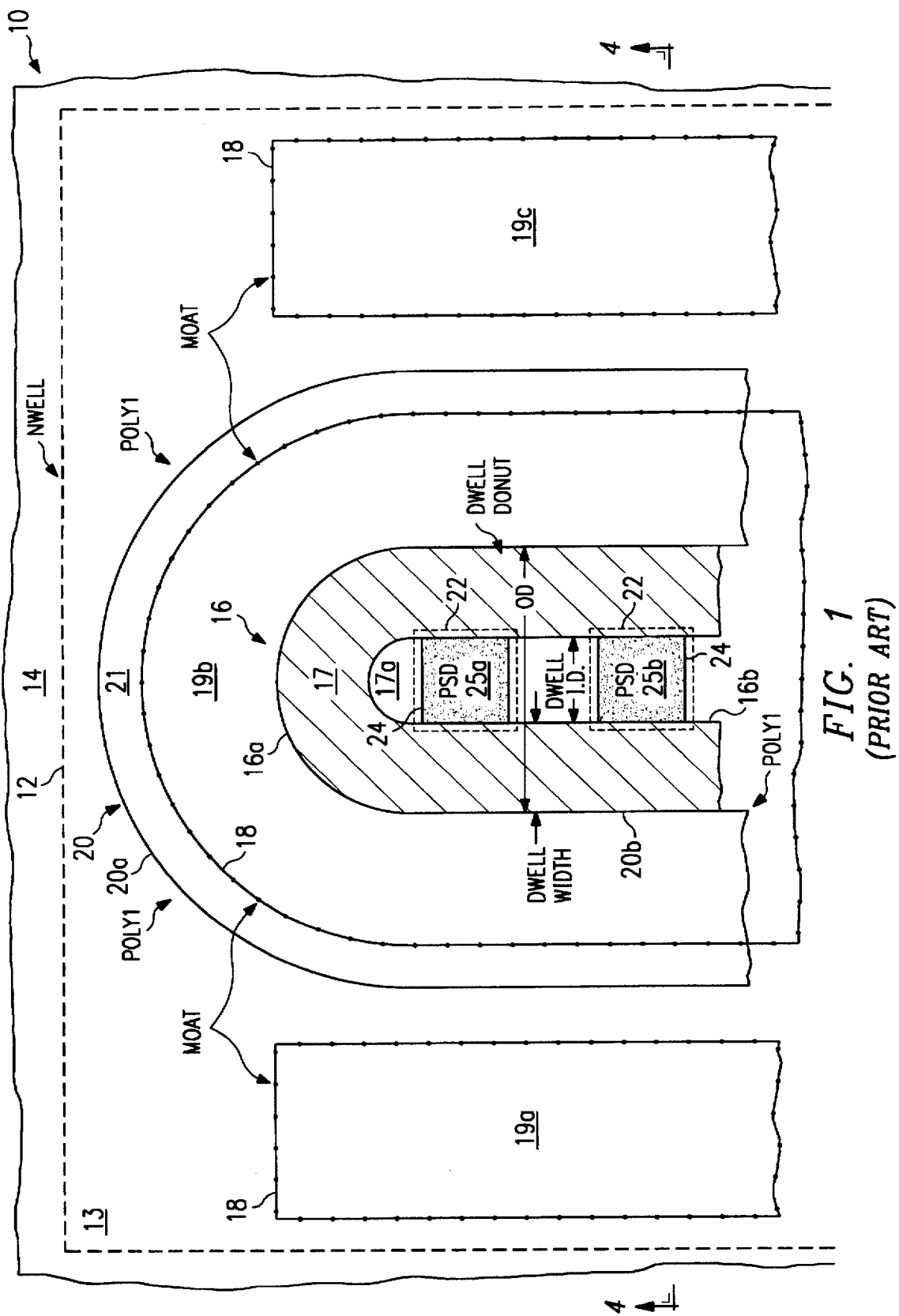
FIG. 1 is a layout plan view showing mask levels of a DMOS transistor according to the prior art.

FIG. 1 is a layout plan view showing mask levels used during fabrication of a DMOS transistor 10 according to the prior art. The mask levels are described in the order in which they are used. As seen in FIG. 1, an Nwell mask level 12 exposes an area 13 of a p type epitaxial layer 14 in which an n type implant is performed to form an Nwell. Those areas outside of area 13 are covered by Nwell mask level 12. An annular Dwell mask level 16, having an outer edge 16a and inner edge 16b, exposes an annular Dwell area 17 in the n well area 13 in which p and n type implants are performed to form a Dwell having an annular lightly doped n type source/drain region. Those areas outside of arena 17 are covered by Dwell mask level 16. Annular Dwell area 17 surrounds area 17a which is protected during the p and n type implants that form the Dwell. The design strategy for transistor 10 relies on use of annular Dwell mask level 16 to provide unimpeded access to the Dwell backgate region during the formation of p+ backgate contacts.

An inverse active region mask level 18 covers thin oxide extending over areas 19a–c while exposing and permitting field oxide to grow over uncovered areas to define the DMOS transistor active regions. An annular polysilicon gate mask level 20 having outer edge 20a and inner edge 20b protects polysilicon in annular area 21 during gate etch to define the DMOS transistor gate. As seen in FIG. 1, the inner dimension of polysilicon gate mask level 20 is identical to the outer dimension OD of Dwell mask level 16. An inverse n+ source/drain mask level 22 covers regions 25a and 25b leaving the remainder of the device exposed during an n type implant performed to form n+ source/drain contact regions. A p+ backgate contact mask level 24 exposes regions 25a, 25b in which a p type implant is performed to form p+ backgate contact regions. Those areas outside of areas 25a and 25b are covered by mask level 24. The use of annular Dwell mask level 16 permits unimpeded access to the Dwell backgate region during the formation of p+ backgate contacts.

Figure 2:
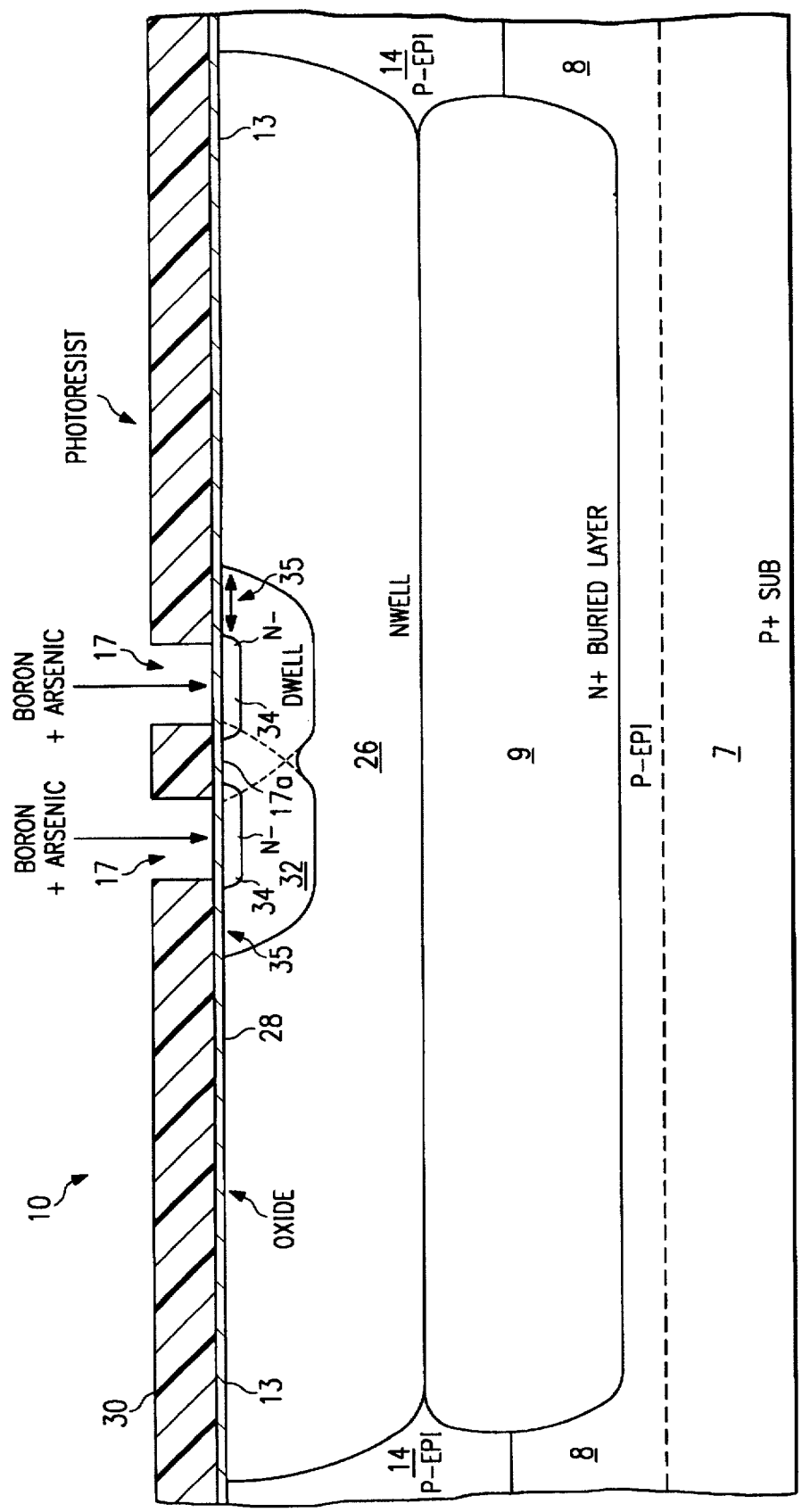
FIGS. 2–4 are cross-sectional elevation views taken along section lines 4—4 of FIG. 1 showing a DMOS transistor according to the prior art at successive stages during fabrication.
Figure 3:
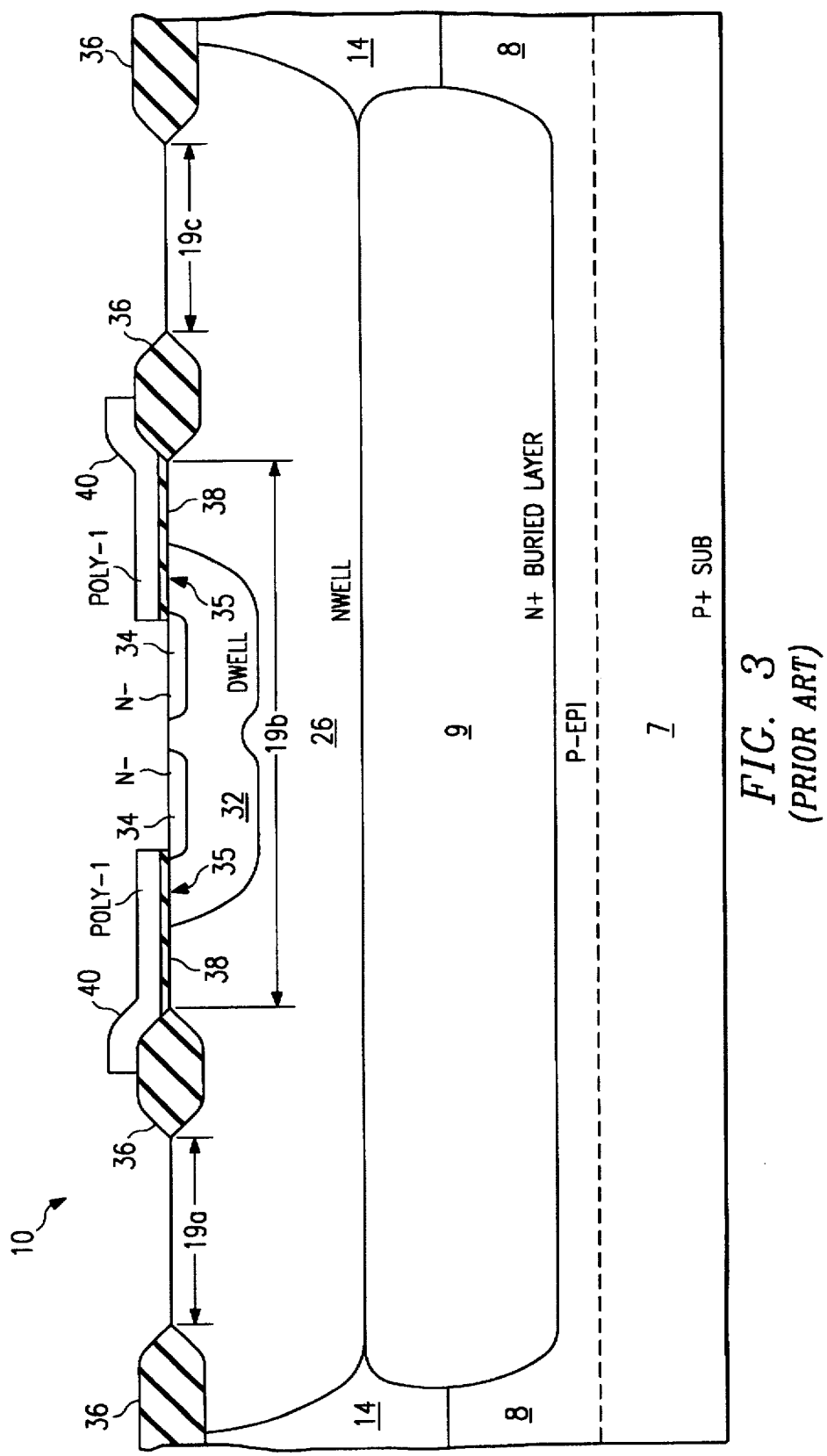
Figure 4:
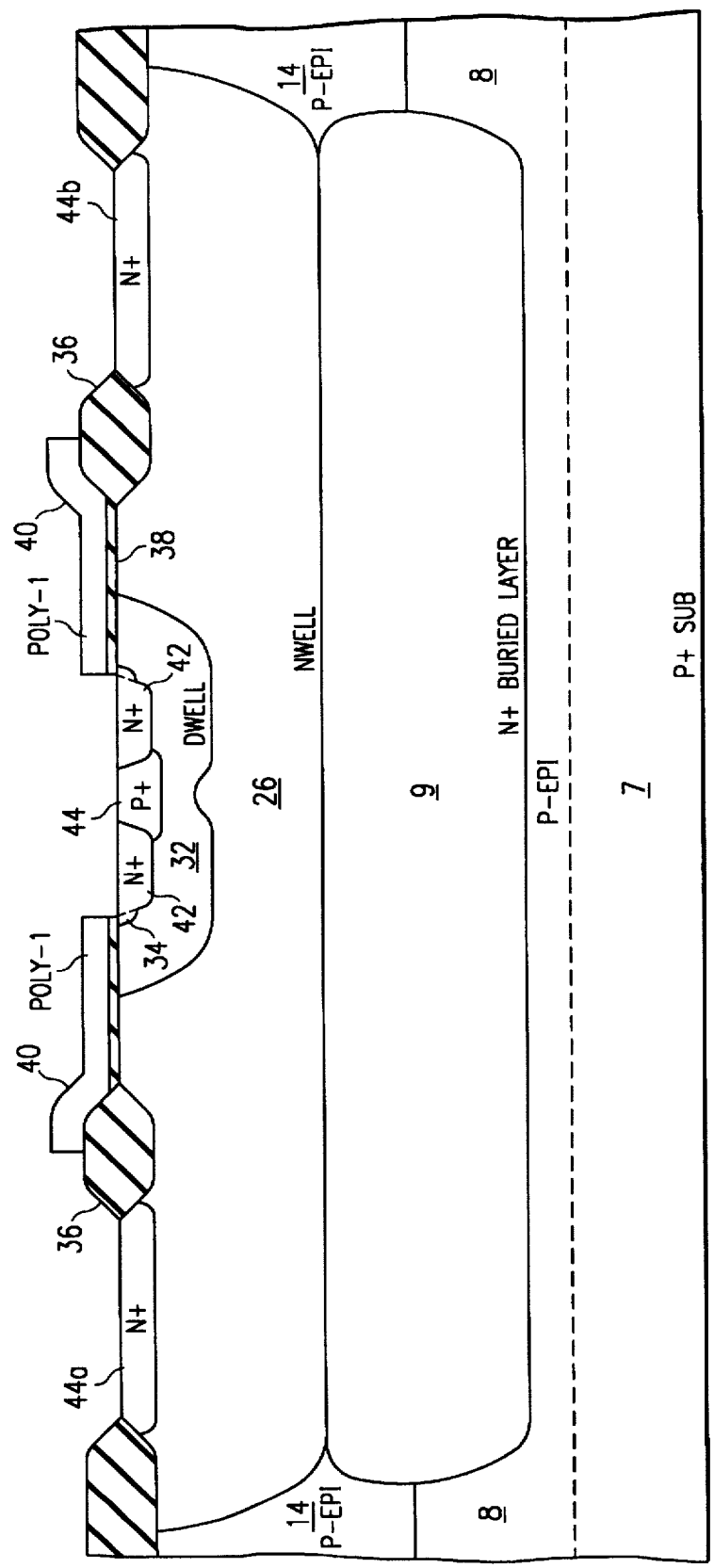

FIGS. 2–4 are cross-sectional elevation views taken along section lines 4—4 of FIG. 1 showing DMOS transistor 10 at successive stages during fabrication. Referring to FIG. 2, a first p– epitaxial layer 8 is initially formed over p+ substrate 7. An n+ region is then implanted in p– epitaxial layer 8 and second p– epitaxial layer 14 formed over first p– epitaxial layer 8 resulting in the formation of n+ buried layer 9 between epitaxial layers 8 and 14. An oxide layer (not shown) is then formed over p– epitaxial layer 14 and patterned and etched using mask level 12 to form a window exposing area 13 (see FIG. 1) at the surface of epitaxial layer 14. An n type dopant, such as phosphorous, is then implanted through the window in p epitaxial layer 14 to form lightly doped Nwell 26 which is the drain of DMOS transistor 10. The oxide layer is then stripped.

An oxide layer 28 having a thickness of about 300 Angstroms is then deposited or grown over the surface of Nwell 26 and epitaxial layer 14. A layer of photoresist 30 is deposited over oxide layer 28 and patterned and etched using Dwell mask level 16 to expose annular area 17 (see FIG. 1) at the face of Nwell 26 while area 17a (see FIG. 1) which is surrounded by area 17 is covered by photoresist 30. Implants of boron and arsenic are sequentially performed in annular area 17 and photoresist layer 30 is then removed. A diffusion is performed to drive in the boron and arsenic implants with the result that the deeper boron implants join in the interior of annular area 17 forming Dwell 32 while the shallower arsenic implants remain separated forming annular lightly doped n– source region 34 as shown in FIG. 2. Annular channel region 35 is defined between outer edges of Dwell 32 and annular source region 34. Oxide layer 28 is then removed.

A pad oxide layer (not shown) having a thickness of about 500 Angstroms is formed over the surface of p– epitaxial layer 14 and Nwell 26. A nitride layer (not shown) having a thickness of about 1400 Angstroms is formed over the pad oxide layer. The nitride layer and pad oxide layer are then patterned and etched using active region mask level 18 to define moat regions 19a–c (see FIG. 1) by exposing the surface of Nwell 26 at locations in which field oxide regions are desired. Thick field oxide regions 36 are then thermally grown in the exposed locations resulting in the structure as shown in FIG. 3.

The pad oxide layer and nitride layer are then removed, for example by plasma etching. A gate oxide layer 38 is then thermally grown over the face of Nwell 26 between those field oxide regions 36 to a thickness of about 150–500 Angstroms. A polysilicon layer is then deposited over gate oxide layer 38 and field oxide regions 36 and doped with an impurity such as phosphorus to render it conductive. The polysilicon layer is patterned and the polysilicon layer and gate oxide layer 38 etched to form annular gate 40 as shown in FIG. 3. Annular gate 40 covers annular channel region 35 and extends up onto field oxide regions 36 to provide high-voltage field plating.

A layer of photoresist (not shown) is formed over the device and patterned and etched using inverse n+ source/drain level mask 22 to block regions 25a and 25b (see FIG. 1) while exposing the remainder of the device. An implant of an n type impurity, such as arsenic, for example, is then performed to form annular n+ source contact region 42 and n+ drain contact regions 44a and 44b. N+ source contact region 42 extends through N– source region 34. N+ drain contact regions 44a and 44b contact Nwell drain 26.

A layer of photoresist (not shown) is then formed over the device and patterned and etched using p+ backgate contact mask level 24 to expose region 25a and 25b (see FIG. 1). A p type dopant, for example boron, is then implanted in regions 25a and 25b to form p+ backgate contact regions 44 resulting in the structure shown in FIG. 4. Backgate contact regions 44 improve contact to the Dwell 32 backgate. P+ backgate contact regions 44 are allowed to butt into n+ source contact region 42 since they are tied together by a metal contact (not shown) in typical power IC applications.

Figure 5:
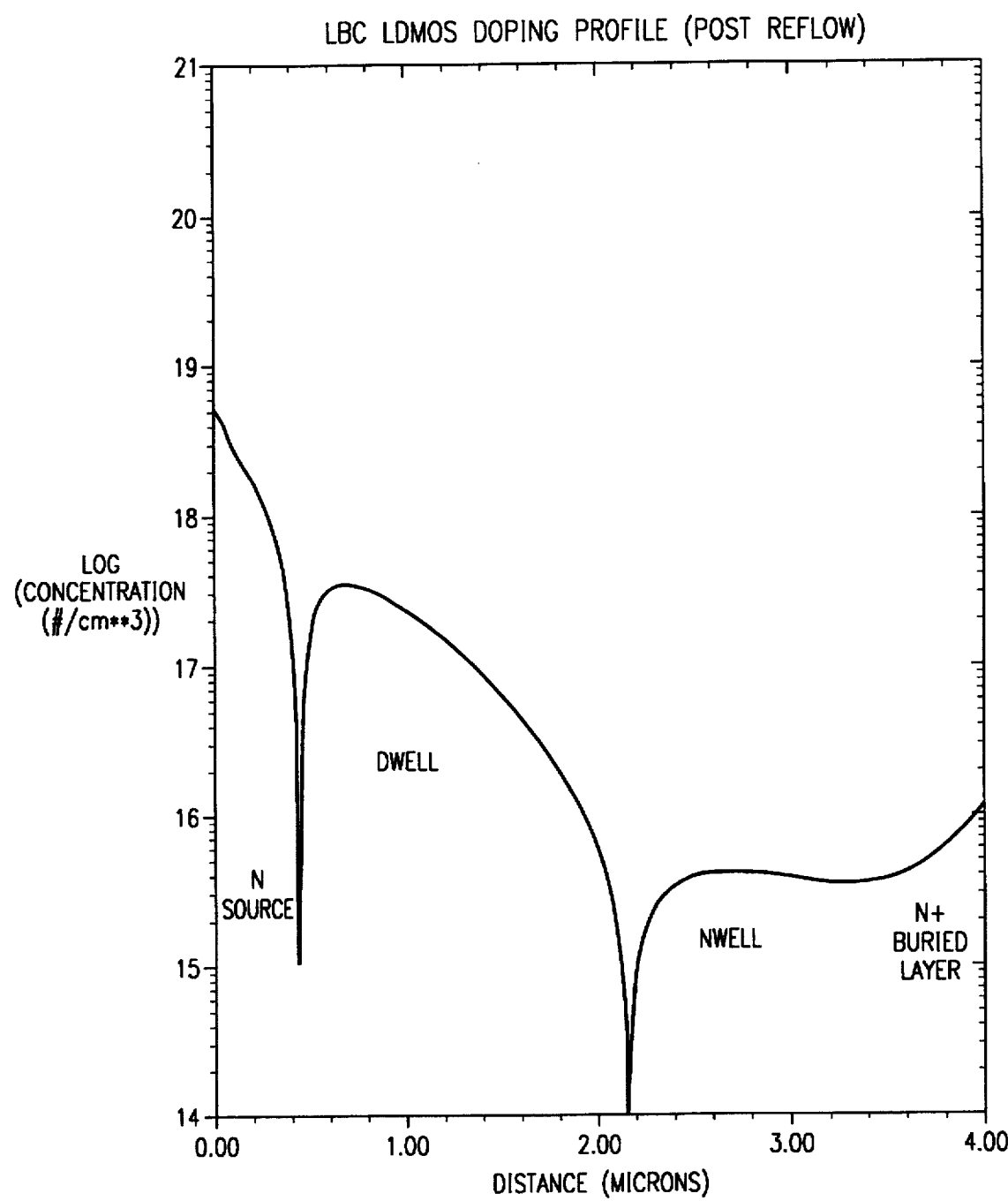
FIG. 5 is a graph of the vertical doping profile taken through the source region of the DMOS transistor of FIG. 4.

FIG. 5 is a graph showing the vertical doping profile through the source region 34 of transistor 10 in FIG. 4. As seen in FIG. 5, transistor 10 has Dwell and source junction depths of about 2.0 and 0.4 microns, respectively. Since the lateral out-diffusion is about 80% of the vertical diffusion, the double-diffused channel length is about 1.3 microns ((2.0–0.4) ×0.8=1.28). Since this channel length must support high OFF-state reverse voltage, it is critical that it not be compromised or vary greatly in production. As will be seen, attempts to scale DMOS transistor 10 have an adverse effect on channel length.

The fact that the design strategy for transistor 10 uses annular Dwell mask level 16 to provide unimpeded access to the Dwell backgate region during the formation of p+ backgate contacts results in considerable wasted area. This is demonstrated by the following analysis referenced to FIG. 1 and based on a process having the following design rules for the Dwell and polysilicon gate that will result in a DMOS transistor having the doping profile of FIG. 5:

1.) Dwell inner dimension (ID)=2.0 microns

2.) Dwell width (W)=2.0 microns

3.) Dwell outer dimension (OD)=6.0 microns

4.) Dwell overlay of poly gate=0.0 microns

5.) contact width=1.0 microns

6.) contact-to-poly spacing=1.0 microns

These design rules result in a polygate inner dimension that is equal to the Dwell outer dimension (OD) of 6.0 microns. This is in contrast to the minimum poly gate inner dimension of 3.0 microns (1.0 micron contact to poly spacing +1.0 microns contact width +1.0 micron contact to poly spacing) that would result if this dimension were dictated solely by the contact width and contact to poly spacing. A poly gate inner dimension of 3.0 microns translates into a Dwell outer dimension (OD) of 3.0 microns. If the Dwell inner dimension (ID) remains fixed at 2.0 microns to provide unimpeded backgate contact, the Dwell width (W) must shrink to 0.5 microns. This width is much smaller than the desired Dwell junction depth of about 2.0 microns for device 10 as seen in FIG. 5. A width this narrow poses severe lithography problems and, in addition, results in greatly reduced lateral out-diffusion of the Dwell and thus reduced channel length. Attempts to scale device 10 by relying on the minimum poly to poly spacing dictated solely by the contact width and contact to poly spacing will thus adversely affect puchthrough BVdss behavior.

Figure 6:
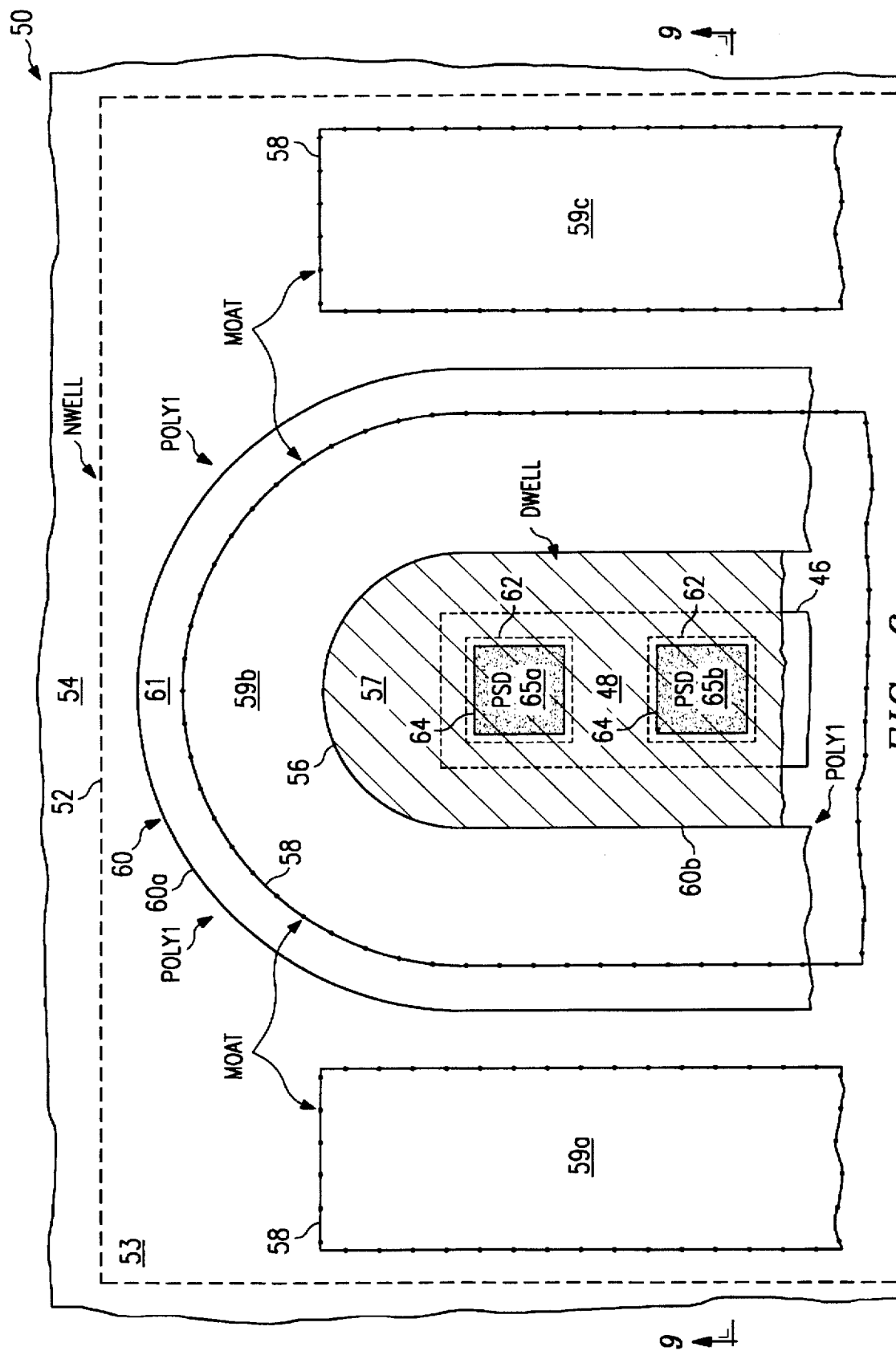
FIG. 6 is a layout plan view showing mask levels of a DMOS transistor according to a first embodiment of the present invention.

FIG. 6 is a layout plan view showing mask levels used during fabrication of a DMOS transistor 50 according to the present invention. The mask levels are described in the order in which they are used. As seen in FIG. 6, an Nwell mask level 52 exposes an area 53 of a p epitaxial layer 54 in which an n type implant is performed to form an Nwell. Those areas outside of area 53 are covered by Nwell mask level 52. A non-annular Dwell mask level 56 exposes an area 57 in the Nwell area 53 in which p and n type implants are performed to form a Dwell having a non-annular lightly doped n type source/drain region. Those areas outside of area 57 are covered by Dwell mask level 56. An optional deep p+ mask level 46 exposes an area 48 in which a deep p+ implant may be performed to improve the SOA (safe operating area) of transistor 50. Those areas outside of area 48 are covered by mask level 46. An inverse active region mask level 58 covers thin oxide extending over areas 59a–c while exposing and permitting field oxide to grow over uncovered areas to define the DMOS transistor active regions.

An annular polysilicon gate mask level 60 having outer edge 60a and inner edge 60b protects polysilicon in area 61 during gate etch to define the DMOS transistor gate. As seen in FIG. 6, the inner dimension of polysilicon gate mask level 60 is identical to the outer dimension of Dwell mask level 56. An inverse n+ source/drain mask level 62 covers regions 65a and 65b from an n type implant that is performed in uncovered areas to form n+ source/drain contact regions. A p+ backgate contact mask level 64 exposes regions 65a and 65b in which a p type implant is performed to form p+ backgate contact regions. Those areas outside of areas 65a and 65b are covered by mask level 64.

Although the use of non-annular Dwell mask level 56 results in impeded access to the Dwell backgate region during the formation of p+ backgate contacts, the present invention provides good contact to the Dwell backgate region while allowing the inner dimension of polysilicon gate mask level 60 to shrink to the minimum dictated by the contact width And contact-to-polysilicon spacing rules of the process being used as will be apparent from the discussion below.

Figure 7:
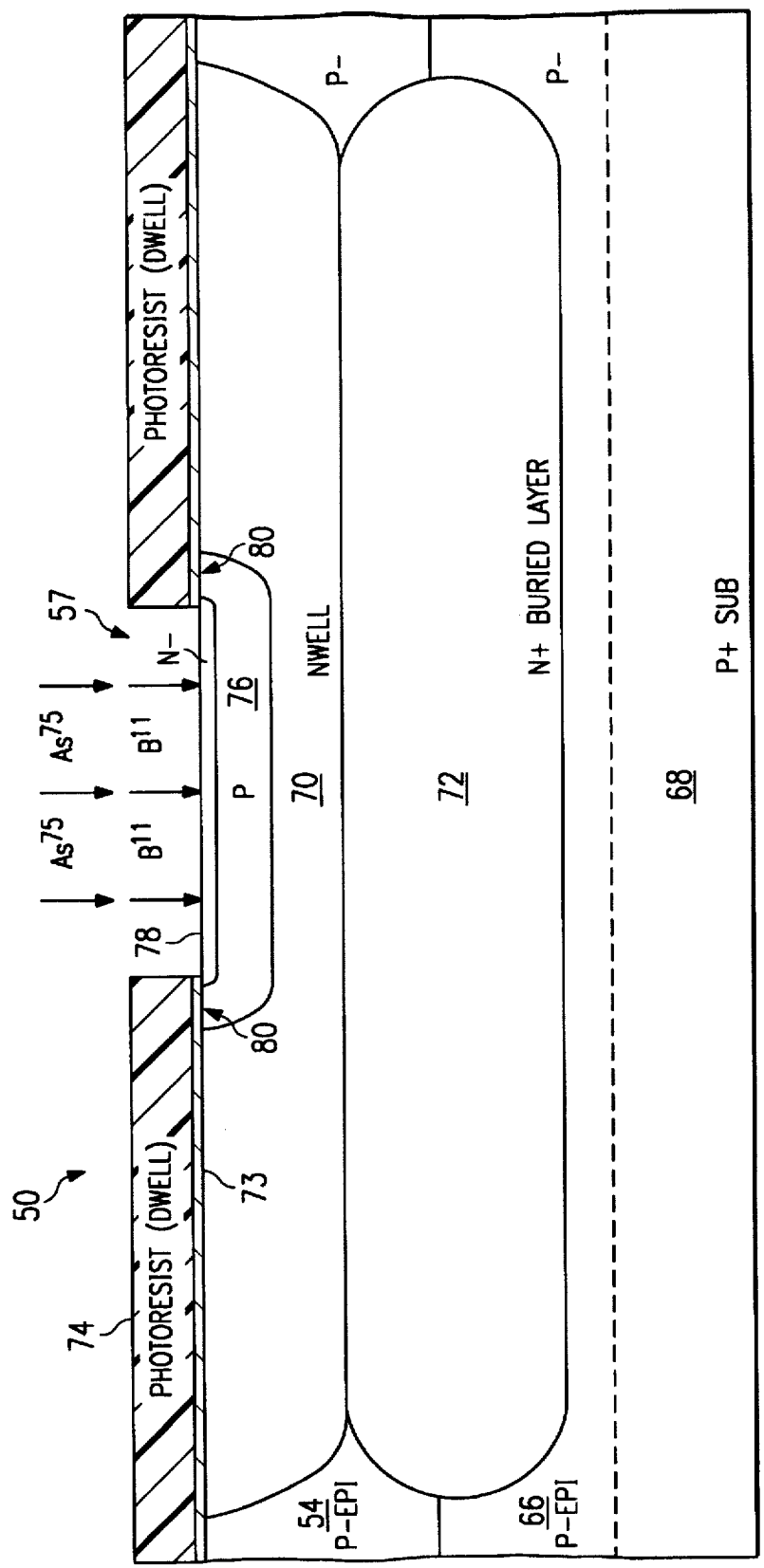
FIGS. 7–9 are cross-sectional elevation views taken along section lines 9—9 of FIG. 6 showing a DMOS transistor according to the first embodiment of the present invention at successive stages during fabrication.
Figure 8:
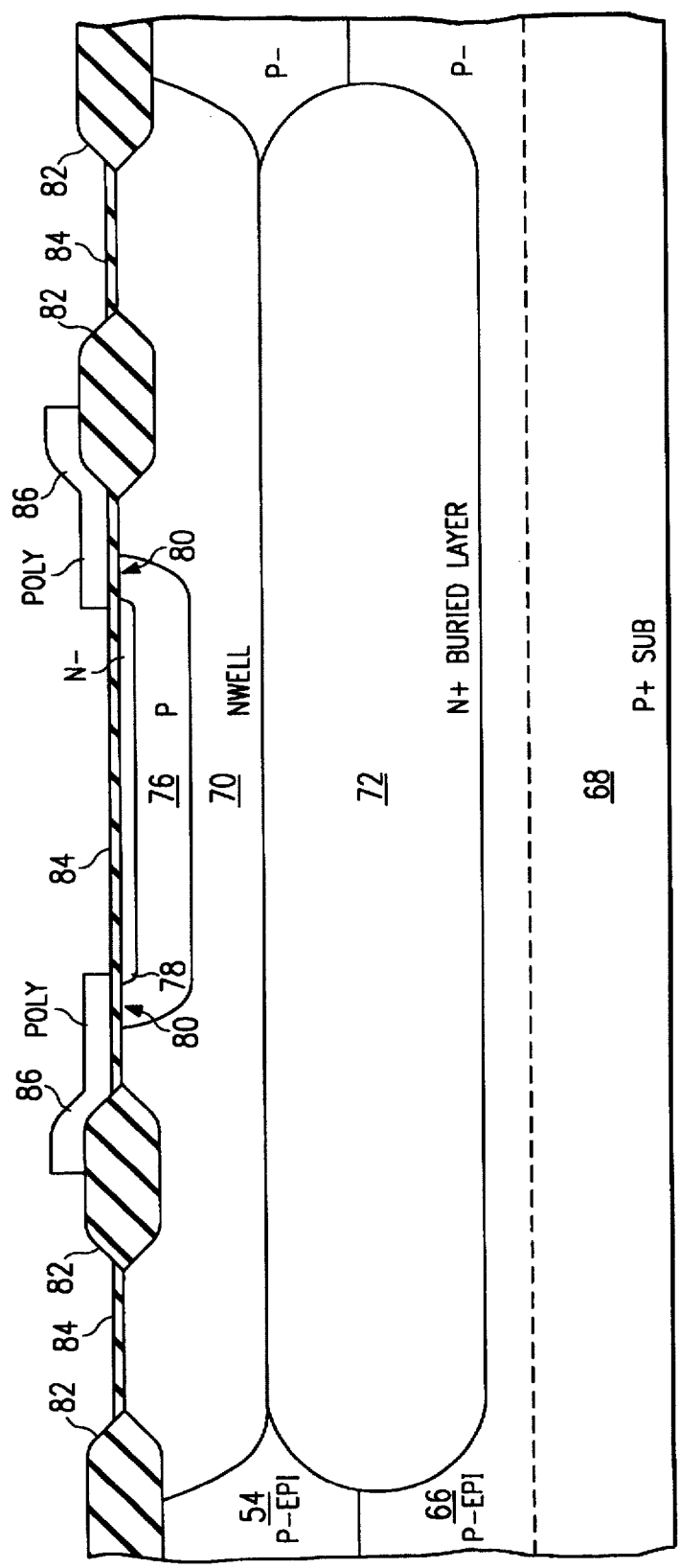
Figure 9:
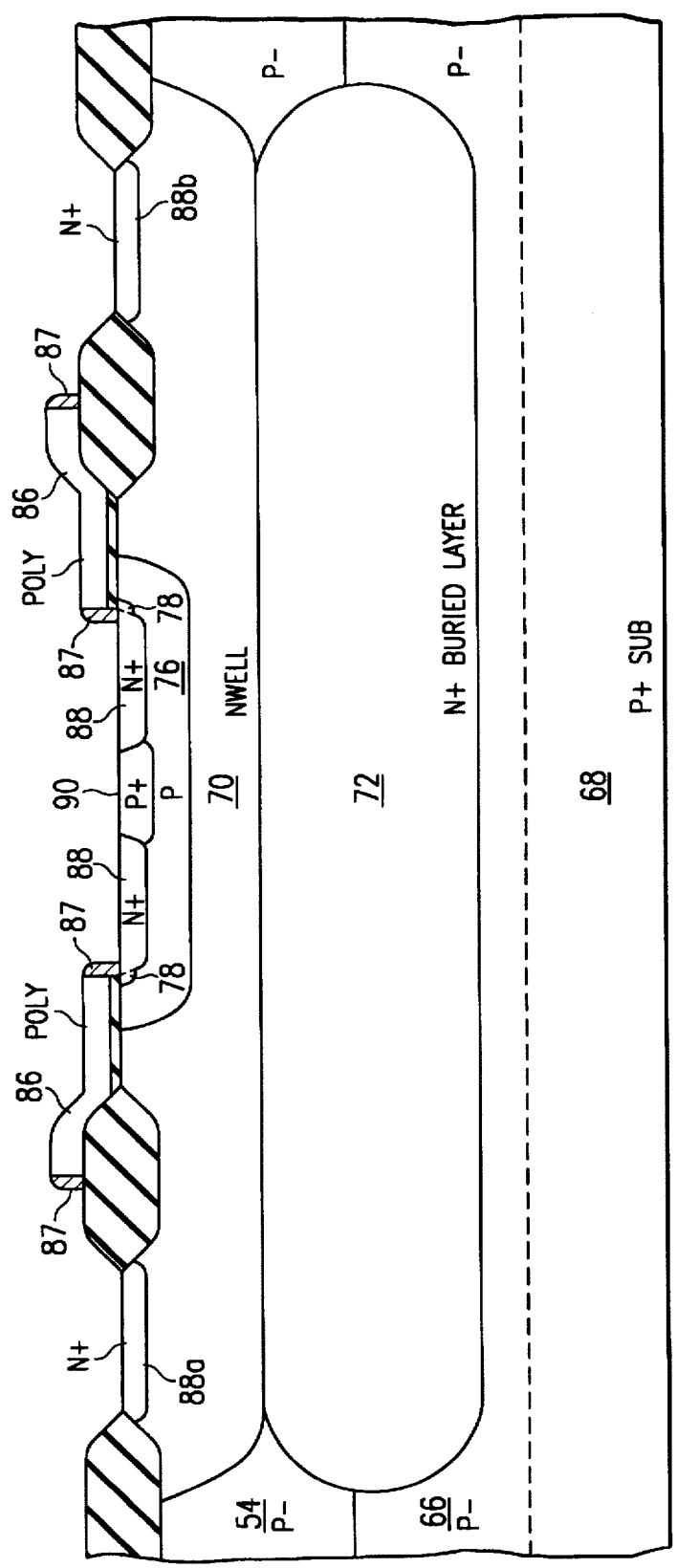

FIGS. 7–9 are cross-sectional elevation views taken along section lines 9—9 of FIG. 6 showing DMOS transistor 50 at successive stages during fabrication. Referring to FIG. 7, fabrication of DMOS transistor 50 initially begins with the formation of first p– epitaxial layer 66 having a thickness of about 20 microns and resistivity of about 7 $\Omega$-cm on p+ substrate 68 which has a thickness of about 625 microns and resistivity of about 0.015 $\Omega$-cm. An oxide layer (not shown) is then formed over first epitaxial layer 66 and patterned and etched to expose a region in which a buried n+ layer will be formed. The exposed region is then implanted with an n type dopant, such as antimony with a dose of about 6.0E15 atoms/cm$^2$ at an energy of approximately 60 KeV, to form an n+ region. The remainder of the oxide layer is then removed, using a plasma etch, for example.

A second p– epitaxial layer 54 having a thickness of about 8.5 microns and resistivity of about 7 $\Omega$-cm is then formed over first p– epitaxial layer 66 and the n+ region with the result that the n+ region becomes a n+ buried layer 72. An oxide layer (not shown) is then formed over p– epitaxial layer 54 and patterned and etched using mask level 52 to form a window exposing area 53. (see FIG. 6) at the surface of epitaxial layer 54. An n type dopant, such as phosphorous with a dose of about 3.7E12 atoms/cm$^2$ at an energy of about 150 KeV, is then implanted through the window in p epitaxial layer 54 to form lightly doped Nwell 70 which is the drain of DMOS transistor 50. Lightly doped Nwell 70 extends to n+ buried layer 72. The remainder of the oxide layer is then removed, using a plasma etch, for example.

An oxide layer 73 having a thickness of about 300 Angstroms is then deposited or grown over the surface of Nwell 70 and epitaxial layer 54. A layer of photoresist 74 is deposited over oxide layer 73 and patterned and etched using Dwell mask level 56 to expose area 57 (see FIG. 6) at the face of Nwell 70. Implants of p and n type dopants, with the n type dopant having substantially less diffusivity than the p type dopant, are sequentially performed in area 57. A suitable p type dopant is boron with a dose of about 8.5E13 atoms/cm$^2$ at an energy of about 50 KeV. A suitable n type dopant is arsenic with a dose of about 1.0E14 atoms/cm$^2$ at an energy of about 150 KeV. Photoresist layer 74 is then removed. A drive-in step, for example 80 minutes at 1100 degrees Centigrade, is performed to drive in the boron and arsenic implants with the result that the deeper boron implant forms Dwell 76 while the shallower arsenic implants form lightly doped n– source region 78 as shown in FIG. 7. Annular channel region 80 is defined between outer edges of Dwell 76 and source region 78. Oxide layer 73 is then removed.

A pad oxide layer (not shown) having a thickness of about 500 Angstroms is formed over the surface of p epitaxial layer 54 and Nwell 70. An LPCVD nitride layer (not shown) having a thickness of about 1400 Angstroms is formed over the pad oxide layer. Optional deep p+ processing can then performed to improve the SOA (safe operating area) performance which is a measure of the device's ability to withstand harsh transients. This processing includes the patterning of a photoresist layer using optional p+ mask level 46 to expose area 48 (see FIG. 6). A p+ implant, for example a boron dose of about 2E15 atoms/cm$^2$, is then performed in area 48. Subsequent heat cycles in the process drive the deep p+ implant to a depth of about 2 microns. This p+ implant is not heavy enough to counterdope subsequently formed n+ source contact region 88 (see FIG. 9) but does extend below n+ region 88 to improve SOA by killing the gain of a parasitic NPN transistor formed by regions 88, 76, and 70.

The nitride layer and pad oxide layer are then patterned and etched using inverse active region mask level 58 to define moat regions 59a–c (see FIG. 6) by exposing the surface of Nwell 56 at locations in which field oxide regions are desired. Thick field oxide regions 82, having a thickness of 12000 Angstroms, for example, are then thermally grown in the exposed locations as shown in FIG. 8.

The pad oxide layer and nitride layer are then removed, for example by plasma etching. A gate oxide layer 84 is then thermally grown over the face of Nwell 70 between field oxide regions 82 to a thickness of about 150–500 Angstroms. A polysilicon layer is then deposited over gate oxide layer 84 and field oxide regions 82 and doped with an impurity such as phosphorus to render it conductive. The polysilicon layer is patterned with polysilicon gate level mask 60 and the polysilicon layer etched to form annular gate 86 resulting in the structure shown in FIG. 8. Annular gate 86 covers annular channel region 80 and extends up onto field oxide regions 82 to provide high-voltage field plating.

A dielectric layer of oxide or nitride, for example, is then formed over the device and anisotropically etched to form sidewall spacers 87 on the sidewalls of gate 86. A layer of photoresist (not shown) is formed over the device and patterned and etched using inverse n+ source/drain level mask 62 to block regions 65a and 65b (see FIG. 6) while exposing the remainder of the device. An implant of an n type impurity, such as arsenic with a dose of about 8.0E15 atoms/cm$^2$ at an energy of about 135 KeV, for example, is then performed to form annular n+ source contact region 88 and n+ drain contact regions 88a and 88b. N+ source contact region 88 contacts n– source region 78. N+ drain contact regions 88a and 88b contact Nwell drain 70.

A layer of photoresist (not shown) is then formed over the device and patterned and etched using p+ backgate contact mask level 64 to expose regions 65a and 65b (see FIG. 6). A p type dopant, for example boron with a dose of about 4.0E15 atoms/cm$^2$ at an energy of about 40 KeV, is then implanted in regions 65a and 65b to form p+ backgate contact regions 90 resulting in the structure shown in FIG. 9. Backgate contact regions 90 are implanted so as to extend through n– source region 78 to provide good contact to the Dwell 76 backgate. Metal contacts (not shown) are then formed using conventional techniques to contact annular n+ contact region 88, n+ drain contact regions 88a and 88b, and p+ backgate contact regions 90. P+ backgate contact regions 90 abut n+ source contact region 88 since they are tied together by a metal contact (not shown) in typical power IC applications.

Figure 10:
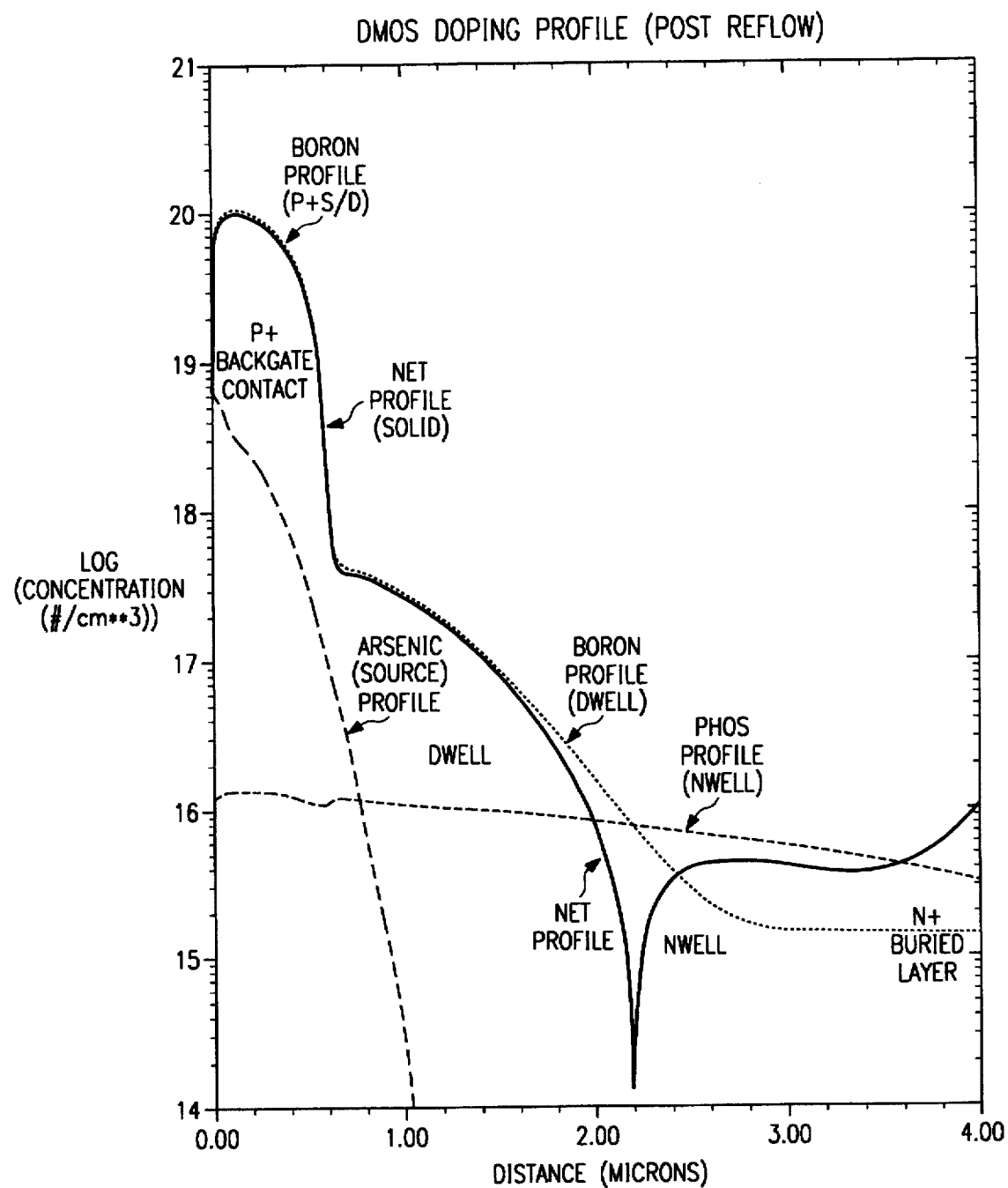
FIG. 10 is a graph of the vertical doping profile taken through the p+ backgate contact region of the DMOS transistor of FIG. 9.

FIG. 10 is a graph showing the vertical doping profile through the p+ backgate contact 90 of transistor 50 in FIG. 8. As seen in FIG. 10, the net profile and the boron profile are virtually identical down to Dwell. Hence, the impact of DMOS source region 78 through which p+ backgate contact 90 is implanted is clearly negligible on the quality of the p+ backgate contact 90. The p+ backgate contact overdopes and diffuses through the shallower DMOS source region 78 eliminating the source-Dwell junction in areas 65a and 65b (see FIG. 6) thus making efficient contact to the Dwell backgate. It is an advantage of the invention that effective backgate contact can be made without the waste of space inherent in the prior art unimpeded contact strategy of FIGS. 1–4.

The present invention provides the ability to scale the inner dimension of the polysilicon gate mask level to the minimum dictated by the contact width and contact-to-polysilicon spacing. The scaling provided by the present invention results in a cell pitch reduction of about 5 microns when compared with cell pitches possible with the prior art process of FIGS. 1–4. Experimental results achieved with the scaling afforded by the present invention have resulted in up to a 40% reduction in Rdson*Area when compared with the prior art process of FIGS. 1–4 (2.0 mohm*cm$^2$ for the prior art process vs. 1.2 mohm*cm$^2$ for the process according to the present invention) with no change in BVdss or Vt.

Figure 11:
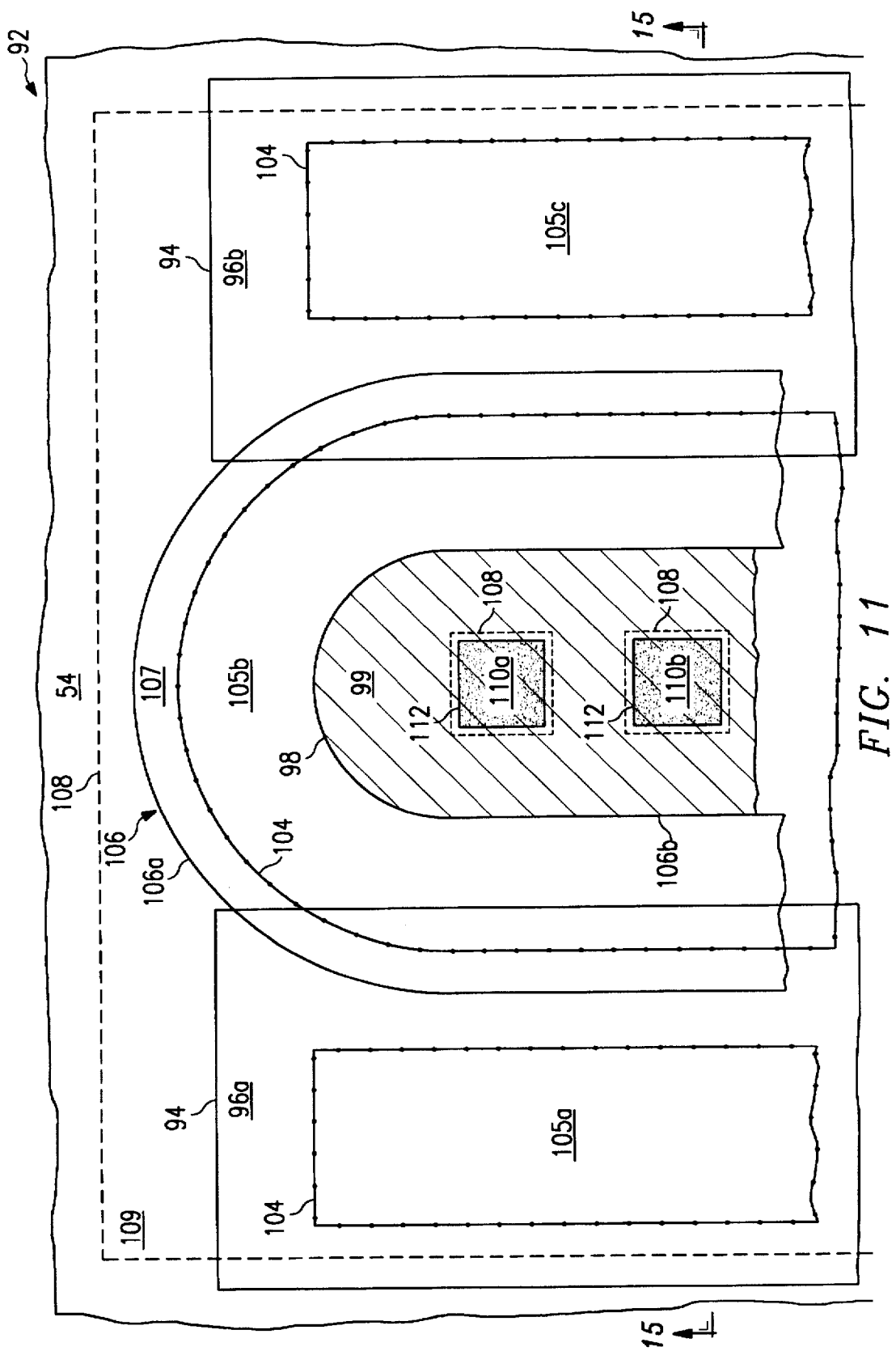
FIG. 11 is a layout plan view showing mask levels of a DMOS transistor according to a second embodiment of the present invention.

FIG. 11 is a layout plan view showing mask levels used during fabrication of a DMOS transistor 92 according to another embodiment of the present invention. The mask levels are described in the order in which they are used. As seen in FIG. 11, a Resurf mask level 94 exposes areas 96a and 96b of a p epitaxial layer 54 in which an n type implant is performed to form Resurf regions. Those areas outside of areas 96a and 96b are covered by Resurf mask level 94. A non-annular Dwell mask level 98 exposes an area 99 between Resurf areas 96a and 96b in which p and n type implants are performed to form a Dwell having a non-annular lightly doped n type source/drain region. Those areas outside of area 99 are covered by Dwell mask level 98. An inverse active region mask level 104 covers thin oxide extending over areas 105a–c while exposing and permitting field oxide to grow over uncovered areas to define the DMOS transistor active regions.

An annular polysilicon gate mask level 106 having outer edge 106a and inner edge 106b protects polysilicon in area 107 during gate etch to define the DMOS transistor gate. As seen in FIG. 11, the inner dimension of polysilicon gate mask level 106 is identical to the outer dimension of Dwell mask level 98. An inverse n+ source/drain mask level 108 covers regions 110a and 110b from an n type implant that is performed in uncovered area 109 to form n+ source/drain contact regions. A p+ backgate contact mask level 112 exposes regions 110a and 110b in which a p type implant is performed to form p+ backgate contact regions. Those areas outside of areas 110a and 110b are covered by mask level 112.

Although the use of non-annular Dwell mask level 98 results in impeded access to the Dwell backgate region during the formation of p+ backgate contacts, the present invention provides good contact to the Dwell backgate region while allowing the inner dimension of polysilicon gate mask level 106 to shrink to the minimum dictated by the contact width and contact-to-polysilicon spacing rules of the process being used.

Figure 12:
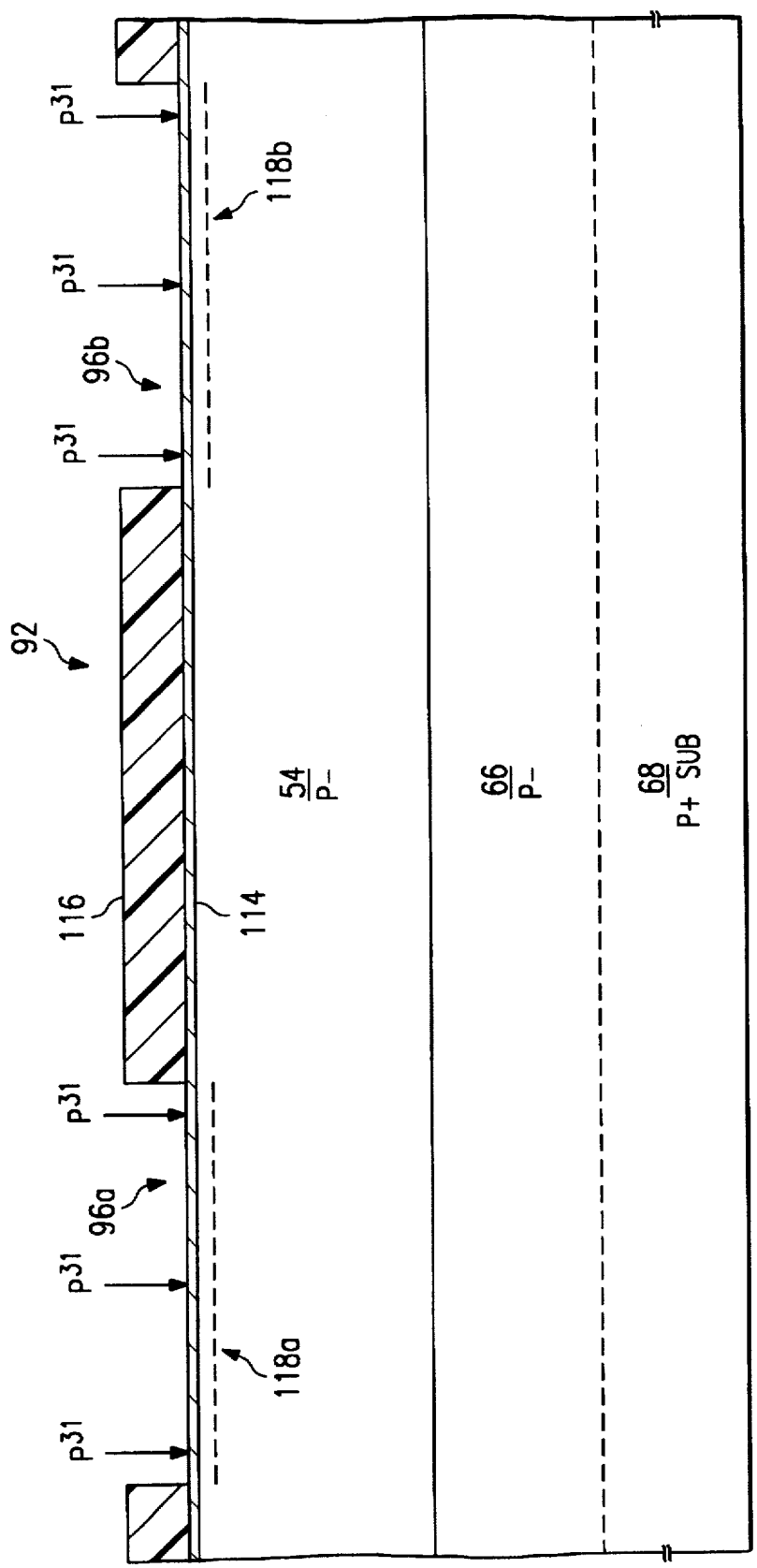
FIGS. 12–15 are cross-sectional elevation views taken along section lines 15—15 of FIG. 11 showing a DMOS transistor according to the second embodiment of the invention at successive stages during fabrication.

FIGS. 12–15 are cross-sectional elevation views taken along section lines 15—15 of FIG. 11 showing DMOS transistor 92 at successive stages during fabrication. Fabrication is described assuming devices (not shown) that require a n+ buried layer are fabricated on the same chip as transistor 92. Referring to FIG. 12, fabrication of DMOS transistor 92 initially begins with the formation of first p– epitaxial layer 66 having a thickness of about 20 microns and resistivity of about 7 Ω-cm on p+ substrate 68 which has a thickness of about 625 microns and resistivity of about 0.015 Ω-cm. An oxide layer (not shown) is then formed over first epitaxial layer 66 and patterned and etched to expose a region in which a n+ buried layer will be formed. The exposed region is then implanted with an n type dopant, such as antimony with a dose of about 6.0E15 atoms/cm$^2$ at an energy of approximately 60 KeV, to form an n+ region. The remainder of the oxide layer is then removed, using a plasma etch, for example.

A second p– epitaxial layer 54 having a thickness of about 8.5 microns and resistivity of about 7 Ω-cm is then formed over first p– epitaxial layer 66 and the n+ region with the result that the n+ region becomes a n+ buried layer (not shown) over which devices requiring the buried layer are subsequently fabricated. An oxide layer 114 having a thickness of about 300 Angstroms is then deposited or grown over the surface of epitaxial layer 54. A layer of photoresist 116 is deposited over oxide layer 114 and patterned and etched using Resurf mask level 94 to expose areas 96a and 96b (see FIG. 11) at the face of epitaxial layer 54. An n type dopant, such as phosphorous with a dose of about 6.0E12 atoms/cm$^2$ at an energy of about 150 KeV, is then implanted through the window in p epitaxial layer 54 to form Resurf regions 118a and 118b, which are the drain of transistor 92. The remainder of photoresist layer 116 is then removed, using a wet etch, for example.

Figure 13:
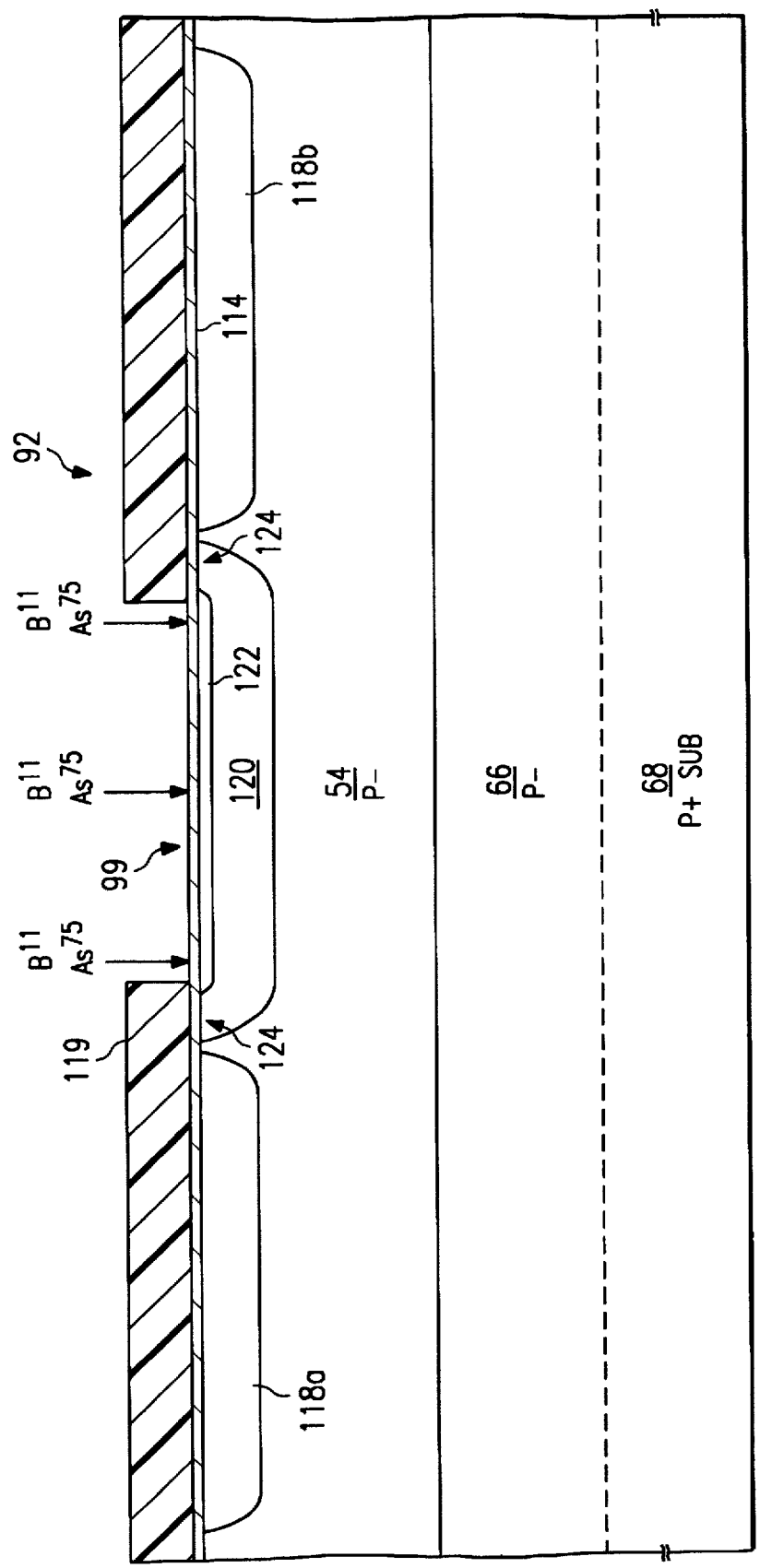

A layer of photoresist 119 is deposited over oxide layer 114 and patterned and etched using Dwell mask level 98 to expose area 99 (see FIG. 11) at the face of epitaxial layer 54 between Resurf regions 118a and 118b. Implants of p and n type dopants, with the n type dopant having substantially less diffusivity than the p type dopant, are sequentially performed in area 99. A suitable p type dopant is boron with a dose of about 8.5E13 atoms/cm$^2$ at an energy of about 50 KeV. A suitable n type dopant is arsenic with a dose of about 1.0E14 atoms/cm$^2$ at an energy of about 150 KeV. Photoresist layer 119 is then removed. A drive-in step, for example 80 minutes at 1100 degrees Centigrade, is performed to drive in the boron and arsenic implants with the result that the deeper boron implant forms Dwell 120 while the shallower arsenic implants form lightly doped n– source region 122 as shown in FIG. 13. The drive-in step also drives Resurf regions 118a and 118b deeper into epitaxial layer 54 as shown in FIG. 13. Annular channel region 124 is defined between outer edges of Dwell 120 and source region 122. Oxide layer 114 is then removed.

Figure 14:
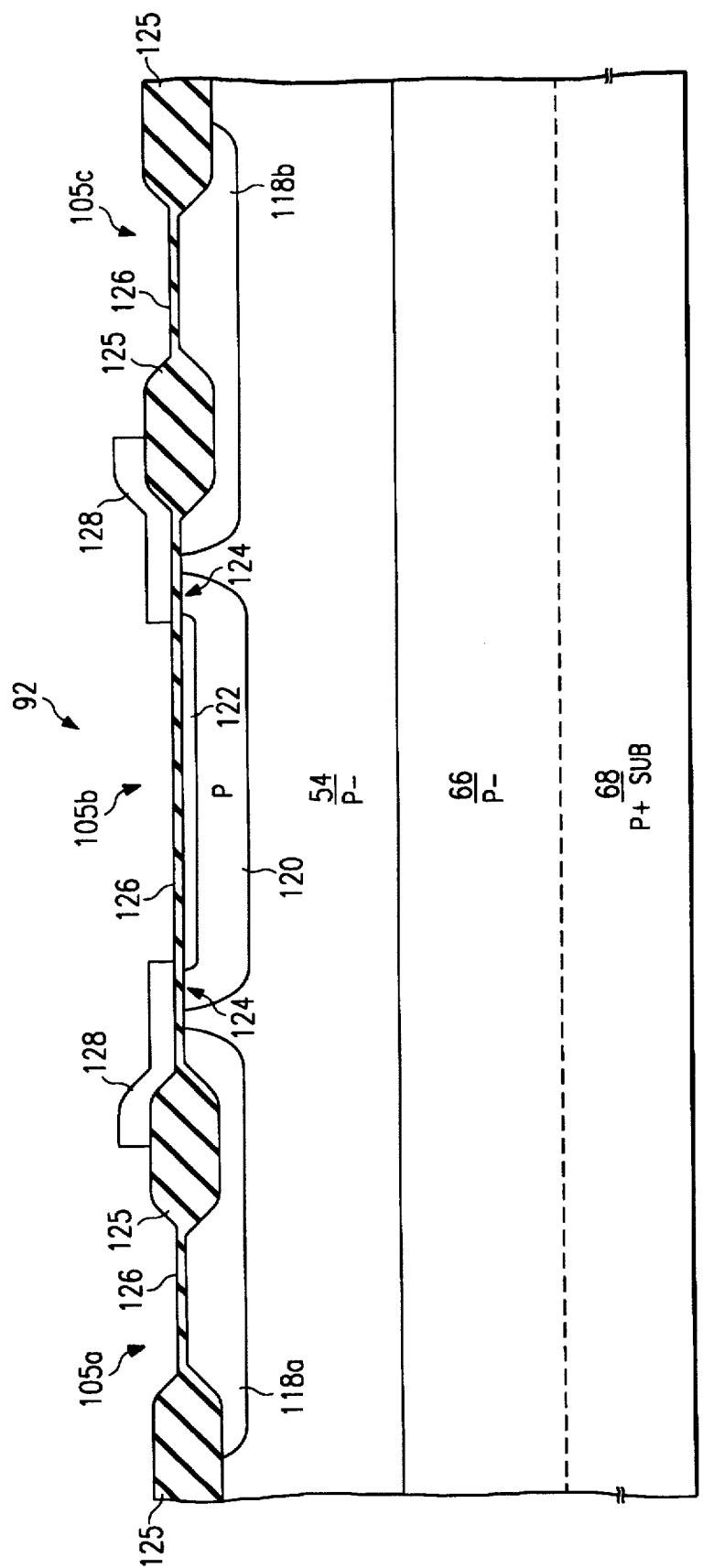
Figure 15:
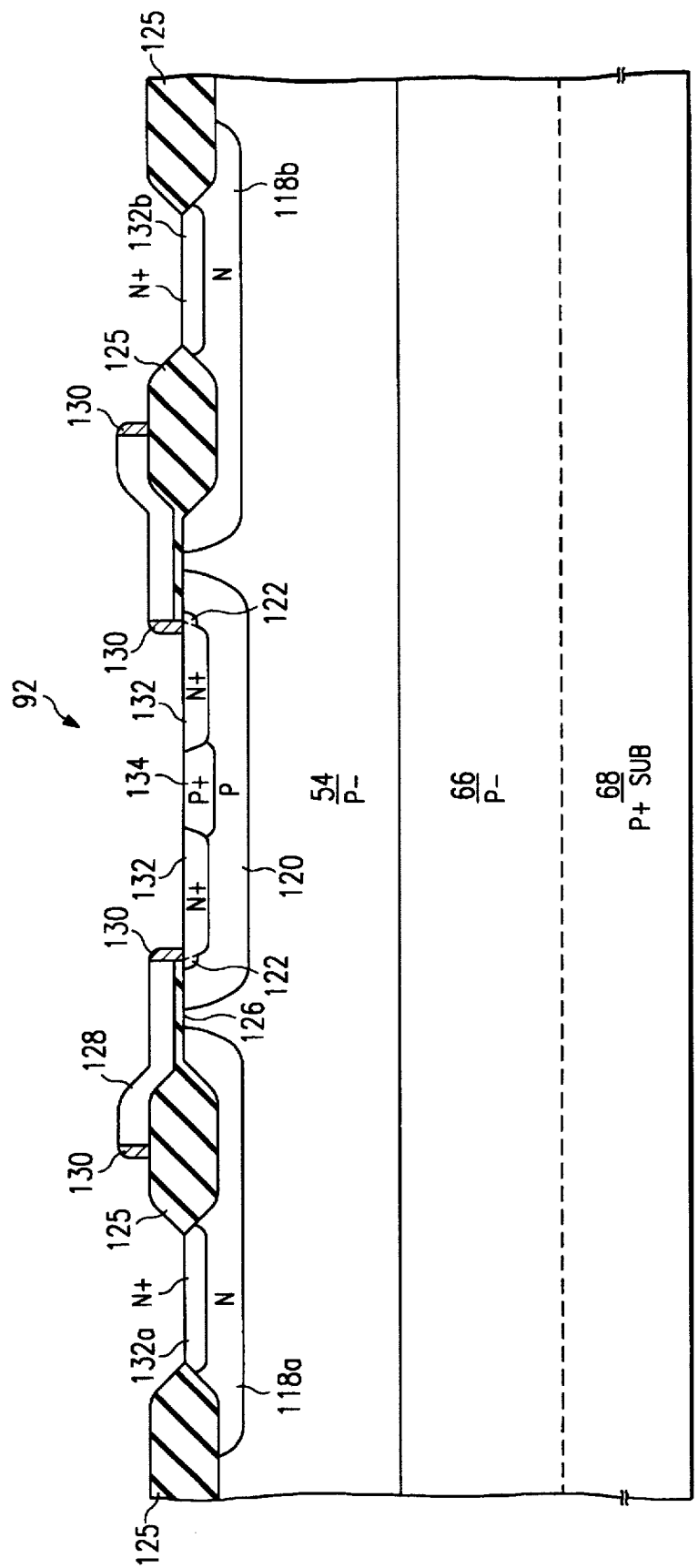

A pad oxide layer (not shown) having a thickness of about 500 Angstroms is formed over the surface of p epitaxial layer 54. An LPCVD nitride layer (not shown) having a thickness of about 1400 Angstroms is formed over the pad oxide layer. The nitride layer and pad oxide layer are then patterned and etched using inverse active region mask level 104 to define moat regions 105a–c (see FIG. 11) by exposing the surface of epitaxial layer 54 at locations in which field oxide regions are desired. Thick field oxide regions 125, having a thickness of 12000 Angstroms, for example, are then thermally grown in the exposed locations as shown in FIG. 14.

The pad oxide layer and nitride layer are then removed, for example by plasma etching. A gate oxide layer 126 is then thermally grown over the face of epitaxial layer 54 between field oxide regions 125 to a thickness of about 150–500 Angstroms. A polysilicon layer is then deposited over gate oxide layer 126 and field oxide regions 125 and doped with an impurity such as phosphorus to render it conductive. The polysilicon layer is patterned with polysilicon gate level mask 106 and the polysilicon layer etched to form annular gate 128 resulting in the structure shown in FIG. 14. Annular gate 128 covers annular channel region 124 and extends up onto field oxide regions 125 to provide high-voltage field plating.

A dielectric layer of oxide or nitride, for example, is then formed over the device and anisotropically etched to form sidewall spacers 130 on the sidewalls of gate 128. A layer of photoresist (not shown) is formed over the device and patterned and etched using inverse n+ source/drain level mask 108 to block regions 110a and 110b (see FIG. 11) while exposing the remainder of the device. An implant of an n type impurity, such as arsenic with a dose of about 8.0E15 atoms/cm$^2$ at an energy of about 135 KeV, for example, is then performed to form annular n+ source contact region 132 and n+ drain contact regions 132a and 132b. N+ source contact region 132 contacts n– source region 122. N+ drain contact regions 132a and 132b contact Resurf regions 118a and 118b.

A layer of photoresist (not shown) is then formed over the device and patterned and etched using p+ backgate contact mask level 112 to expose regions 110a and 110b (see FIG. 11). A p type dopant, for example boron with a dose of about 4.0E15 atoms/cm$^2$ at an energy of about 40 KeV, is then implanted in regions 110a and 110b to form p+ backgate contact regions 134 resulting in the structure shown in FIG. 15. Backgate contact regions 134 are implanted so as to extend through n-source region 122 to provide good contact to the Dwell 120 backgate. Metal contacts (not shown) are then formed using conventional techniques to contact annular n+ source contact region 132, n+ drain contact regions 132a and 132b, and p+ backgate contact regions 134. P+ backgate contact regions 134 abut n+ source contact region 132 since they are tied together by a metal contact (not shown) in typical power IC applications.

A few preferred embodiments have been described in detail hereinabove. It is to be understood that the scope of the invention also comprehends embodiments different from those described, yet within the scope of the claims. For example, the invention could be applied to other DMOS transistor configurations using an annular source region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transistor, comprising:

a semiconductor layer;

a first region of a first conductivity type formed in said semiconductor layer;

a source region of a second conductivity type opposite said first conductivity type formed in said first region, a channel region defined between an edge of said source region and an edge of said first region;

an annular source contact region formed in said source region, said source contact region more heavily doped than said source region, said source contact region annularly surrounding at least one portion of said semiconductor layer at the face of said semiconductor layer, said at least one portion having a first conductivity type dopant concentration substantially equal to that of said source region;

a drain region of said second conductivity type formed in said semiconductor layer, said drain region adjacent said channel region;

a gate extending over said channel region; and a backgate contact region of said first conductivity type formed in said at least one portion of said semiconductor layer, said backgate contact region counterdoping and extending through said at least one portion of said semiconductor layer to contact said first region, said backgate contact region having an outer edge at a face of the semiconductor layer that is coextensive with an inner edge of said annular source contact region.

2. The transistor of claim 1 in which said drain region comprises a Resurf region.

3. The transistor of claim 1 in which said semiconductor layer is of said first conductivity type.

4. The transistor of claim 3 in which said semiconductor layer comprises a first epitaxial layer.

5. The transistor of claim 4 further comprising:

a substrate of said first conductivity type;

a second epitaxial layer formed over said substrate, said first epitaxial layer formed over said second epitaxial layer; and a buried layer of said second conductivity type formed between said first epitaxial layer and said second epitaxial layer, said drain region extending to said buried layer, said first region formed in said drain region.

6. The transistor of claim 1 in which said backgate contact region is more heavily doped than said first region.

7. The transistor of claim 1 in which said gate is polysilicon.

8. The transistor of claim 1 further comprising a thick field oxide region formed over said drain region, said gate extending onto said thick field oxide region.

9. The transistor of claim 1 further comprising a drain contact region formed in said drain region, said drain contact region being more heavily doped than said drain region.

10. The transistor of claim 1 in which said first region is non-annular.

* * * * *